(12) United States Patent
Ando

(10) Patent No.: US 7,064,081 B2
(45) Date of Patent: Jun. 20, 2006

(54) SEMICONDUCTOR DEVICE AND METHOD FOR PRODUCING THE SAME

(75) Inventor: Satoshi Ando, Kyoto (JP)

(73) Assignee: Rohm Co., LTD, Kyoto (JP)

( * ) Notice: Subject to any disclaimer, the term of this patent is extended or adjusted under 35 U.S.C. 154(b) by 0 days.

(21) Appl. No.: 11/249,908

(22) Filed: Oct. 12, 2005

(65) Prior Publication Data

US 2006/0035468 A1 Feb. 16, 2006

Related U.S. Application Data

(62) Division of application No. 10/911,458, filed on Aug. 4, 2004, now Pat. No. 6,974,778, which is a division of application No. 10/268,626, filed on Oct. 10, 2002, now Pat. No. 6,794,758.

(30) Foreign Application Priority Data

Oct. 11, 2001 (JP) ............... 2001-313410

(51) Int. Cl.
*H01L 21/302* (2006.01)

(52) U.S. Cl. ................ 438/736; 438/735

(58) Field of Classification Search ........... 438/735, 438/736, 738, 742
See application file for complete search history.

(56) References Cited

U.S. PATENT DOCUMENTS

| 5,596,230 A | 1/1997 | Hong .................. 257/773 |
| 5,668,398 A | 9/1997 | Havemann et al. ...... 257/773 |
| 6,140,023 A | 10/2000 | Levinson et al. ....... 430/313 |
| 6,358,429 B1 | 3/2002 | Koshido ................ 216/67 |

FOREIGN PATENT DOCUMENTS

| JP | 02-094439 | 4/1990 |
| JP | 08-181146 | 7/1996 |
| JP | 11-274160 | 10/1999 |
| JP | 2000-091311 | 3/2000 |
| JP | 2000-235973 | 8/2000 |
| JP | 2001-057369 | 2/2001 |
| JP | 2001-196376 | 7/2001 |

*Primary Examiner*—Bradley K. Smith
(74) *Attorney, Agent, or Firm*—Hogan & Hartson, LLP

(57) ABSTRACT

The invention provides a semiconductor device having less defectives in shape of a patterned wiring layer even in a case of having a wiring layer for which patterning is required to be carried out over a longer period of etching time, and a method for producing the same. By carrying out dry etching using a fluorine-based gas with a photoresist 17a used as a mask, an auxiliary mask 15a is formed by patterning the insulation membrane. Next, by carrying out dry etching using a chlorine-based gas using the auxiliary mask 15a and the remaining photoresist 17a as masks, wiring 13a is formed by patterning the wiring layer 13. In the second etching, the auxiliary mask 15a is scarcely etched. Therefore, if the thickness of the photoresist 17a is equivalent to that in the prior arts, it is possible to pattern a thicker wiring layer 13 than in the prior arts.

14 Claims, 6 Drawing Sheets

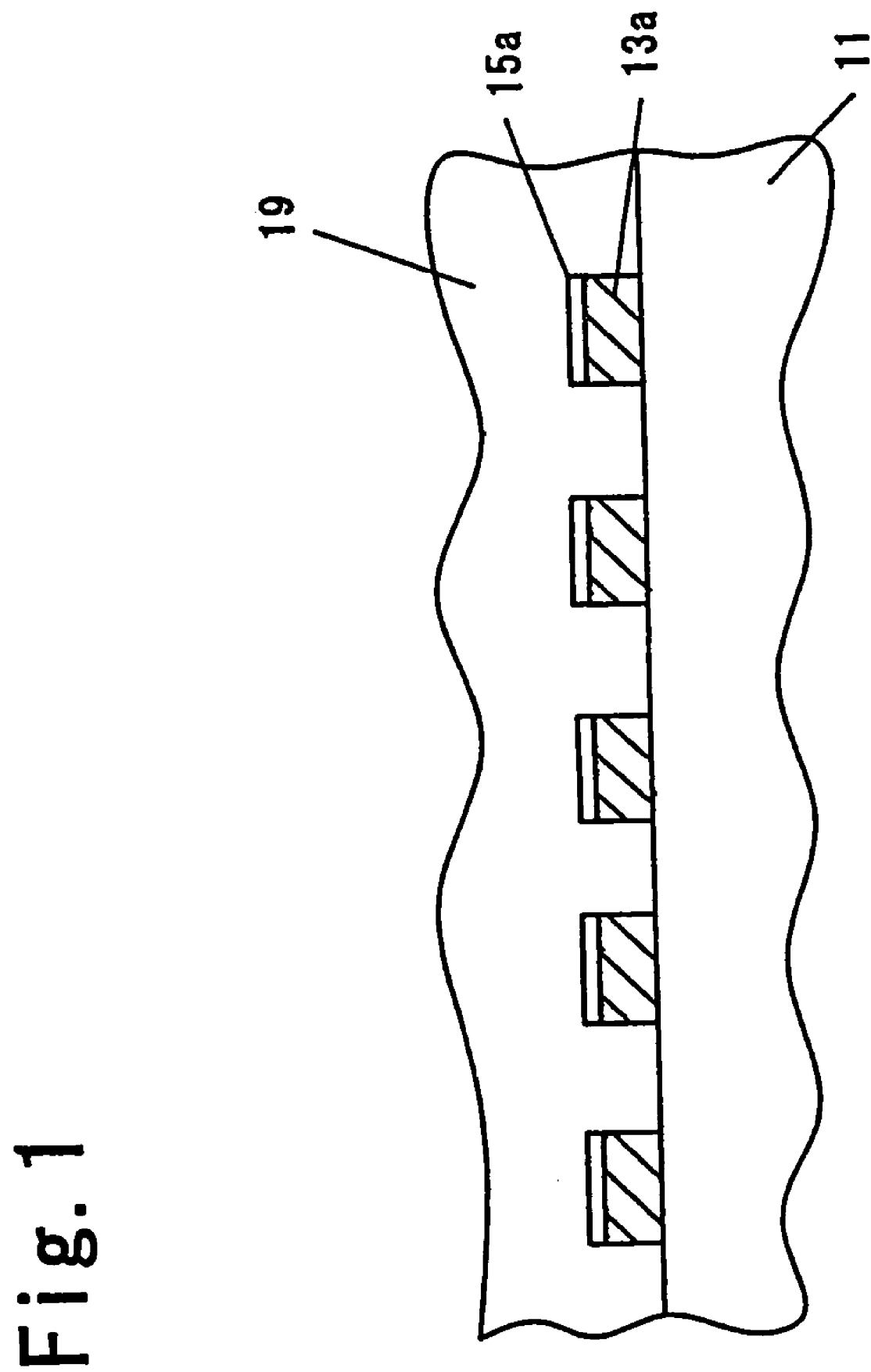

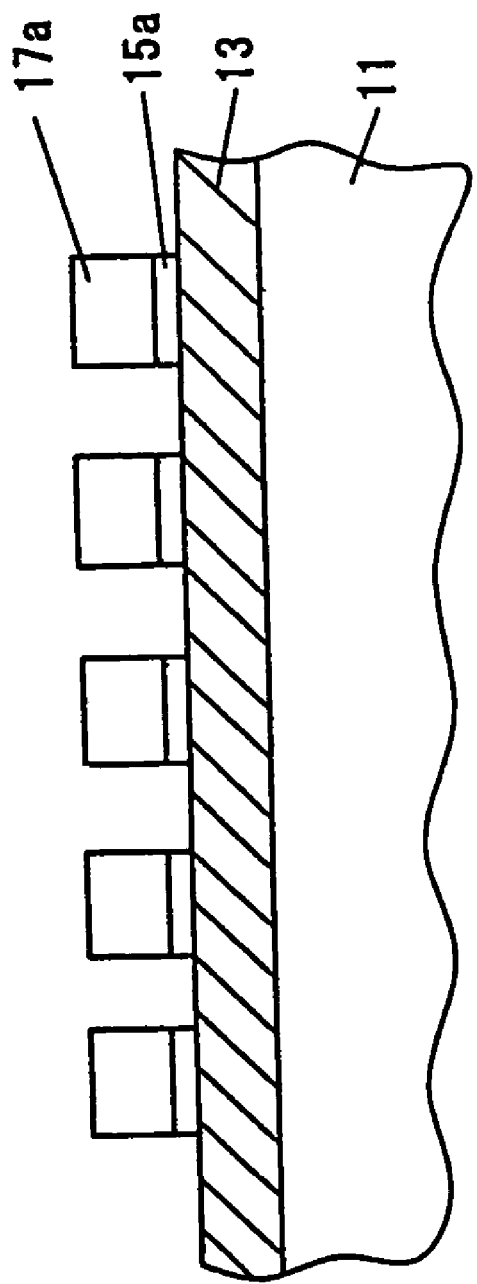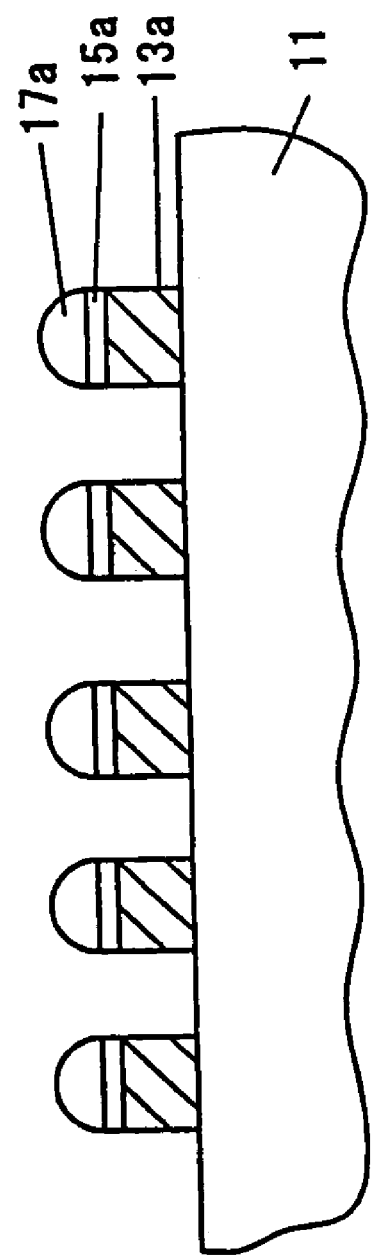

SEMICONDUCTOR DEVICE AND METHOD FOR PRODUCING THE SAME

CROSS-REFERENCE TO RELATED APPLICATIONS

This is a divisional of application Ser. No. 10/911,458 filed Aug. 4, 2004 now U.S. Pat. No. 6,974,778 which is a divisional of application Ser. No. 10/268,626 filed Oct. 10, 2002 now U.S. Pat. No. 6,794,758 issued on Sep. 21, 2004, which applications are hereby incorporated by reference in its entirety. The entire disclosure of a Japanese Patent Application No. 2001-313410 filed on Oct. 11, 2001 including its specification, claims, drawings and summary are incorporated herein by reference in its entirety.

BACKGROUND OF THE INVENTION

1. Field of the Invention

The present invention relates to a semiconductor device and a method for producing the same, and in particular to a technology for patterning electrical wiring, etc.

2. Description of Prior Art

FIG. 5A through FIG. 6B are sectional views of applicable parts to describe a prior art method for forming electrical wiring of a semiconductor device using the photolithography method. In the prior art method, first, as shown in FIG. 5A, a semiconductor substrate 1 covered by a wiring layer 3 is prepared.

Next, as shown in FIG. 5B, photoresist 7a of a prescribed pattern is formed on the wiring layer 3, and etching is carried out by using the photoresist 7a as a mask, wherein the wiring layer 3 is patterned as shown in FIG. 6A. After that, by removing the photoresist 7a, it is possible to form wiring 3a of a desired pattern as shown in FIG. 6B.

However, in the above-described prior art method of forming wiring, there are the following problems. In order to increase integration of a semiconductor device while securing a permissible current value of the wiring 3a (that is, without increasing the electric resistance value of the wiring 3a), the thickness a of the wiring 3a shown in FIG. 6B is made thick, and simultaneously the width b of the wiring 3a and its array pitch may be made narrow. If so, it is possible to decrease the plane projection area of the wiring portion without decreasing the sectional area of the wiring 3a.

However, in order to make the thickness a of the wiring 3a thick, the thickness of the photoresist 7a must be made thick because, when etching the wiring layer 3, the thickness and width of the photoresist 7a are decreased by the etching. That is, it is necessary to provide a photoresist. 7a having a thickness matched to the thickness a of the wiring 3a (in other words, the etching time).

However, if the thickness of the photoresist 7a is made thick, the following problems occur. First, since the time of exposure to form a photoresist 7a becomes long, the photoresist 7a is liable to be deformed by the exposure. Also, many portions where focusing can be scarcely secured in the thickness direction of the photoresist are obliged to occur, resulting in a lowering in the resolution power when exposed. Further, foaming and/or deformation are liable to occur in the photoresist 7a by baking, which is carried out after development, whereby the photoresist 7a is not shaped as per design, resulting in irregular shapes of the wiring 3a.

In addition, when removing the photoresist 7a after etching, some of the photoresist 7a is likely to remain.

Therefore, such a problem occurs, for which reliability in actions and operations of a semiconductor device thus produced may be lowered.

SUMMARY OF THE INVENTION

It is therefore an object of the invention to provide a semiconductor device and a method for producing the same, which are able to solve these problems, and by which almost no irregular shape is brought about in layers to be patterned even in a case of layers to be patterned such as wiring layers required to be patterned over a long etching time. Further, it is another object of the invention to provide a semiconductor device having high reliability in actions and operations and a method for producing the same.

A method for producing a semiconductor device according to the invention comprises the steps of: preparing a semiconductor substrate on which a layer to be patterned is formed; forming an auxiliary mask layer so that the same layer covers said layer to be patterned; forming photoresist of a prescribed pattern so that the photoresist is brought into contact with the auxiliary mask layer on the upper part of the auxiliary mask layer; patterning the auxiliary mask layer by carrying out the first etching for which the etching speed with respect to the photoresist is lower than that with respect to the auxiliary mask layer using the photoresist as a mask, and forming a auxiliary mask; and patterning the layer to be patterned by carrying out the second etching for which the etching speed with respect to the photo resist is lower than that with respect to the layer to be patterned, and is higher than the etching speed with respect to the auxiliary mask, using the auxiliary mask, which is formed through the first etching, and the remaining photoresist as masks.

A semiconductor device according to the invention comprises wiring of a prescribed pattern, which is provided on a semiconductor substrate, and an insulation membrane, which is an insulation membrane utilized as a mask for patterning the wiring, provided in contact with the wiring on the wiring and having the same pattern as that of the wiring.

A semiconductor device according to the invention is formed by: preparing a semiconductor substrate on which a layer to be patterned is formed; forming an auxiliary mask layer so that the same layer covers said layer to be patterned; forming photoresist of a prescribed pattern so that the photoresist is brought into contact with the auxiliary mask layer on the upper part of the auxiliary mask layer; patterning the auxiliary mask layer by carrying out the first etching for which the etching speed with respect to the photoresist is lower than that with respect to the auxiliary mask layer using the photoresist as a mask, and forming a auxiliary mask; and patterning the layer to be patterned by carrying out the second etching for which the etching speed with respect to the photoresist is lower than that with respect to the layer to be patterned, and is higher than the etching speed with respect to the auxiliary mask, using the auxiliary mask, which is formed through the first etching, and the remaining photoresist as masks.

While the features of the present invention are broadly described above, the constitution and contents of the invention, together with the object and features, will become more apparent in the following disclosure in reference to the appended drawings.

BRIEF DESCRIPTION OF THE DRAWINGS

FIG. 1 is a sectional view showing a construction of a wiring portion of an integrated circuit (IC), which is a semiconductor device according to one embodiment of the invention.

FIG. 3A and FIG. 3B are sectional views of appropriate portions for description of a process for forming a wiring portion of the semiconductor device shown in FIG. 1;

DESCRIPTION OF PREFERRED EMBODIMENTS

FIG. 1 is a sectional view showing a construction of a wiring portion of an integrated circuit (IC), which is a semiconductor device according to one embodiment of the invention. As shown in FIG. 1, the wiring portion includes a plurality of wirings 13a and 13a having a prescribed pattern; and a plurality of insulation membranes 15a and 15a, which are provided on a semiconductor substrate 11. In the present embodiment, wirings 13a and 13a are composed of aluminum, and the insulation membranes 15a and 15a are composed of silicon oxide.

The insulation membranes 15a and 15a are left over by the insulation membrane utilized as a mask for patterning the wirings 13a and 13a, and the insulation membranes 15a and 15a are provided in contact with the wirings 13a and 13a on the wirings. Therefore, the patterns of the wirings 13a and 13a are identical to those of the insulation membranes 15a and 15a.

A passivation membrane 19 is formed so that it covers the wirings 13a and 13a and insulation membranes 15a and 15a, which are formed on the semiconductor substrate 11. The feature of the passivation membrane 19 is not specially limited. However, for example, a silicon nitride membrane or a silicon oxide membrane is used.

FIG. 2A through FIG. 3B are sectional views of appropriate portions for description of a process for forming a wiring portion of the semiconductor device shown in FIG. 1. Using FIG. 1 through FIG. 3B, a description is given of a process for forming a wiring portion of the semiconductor device.

Figure 2A:
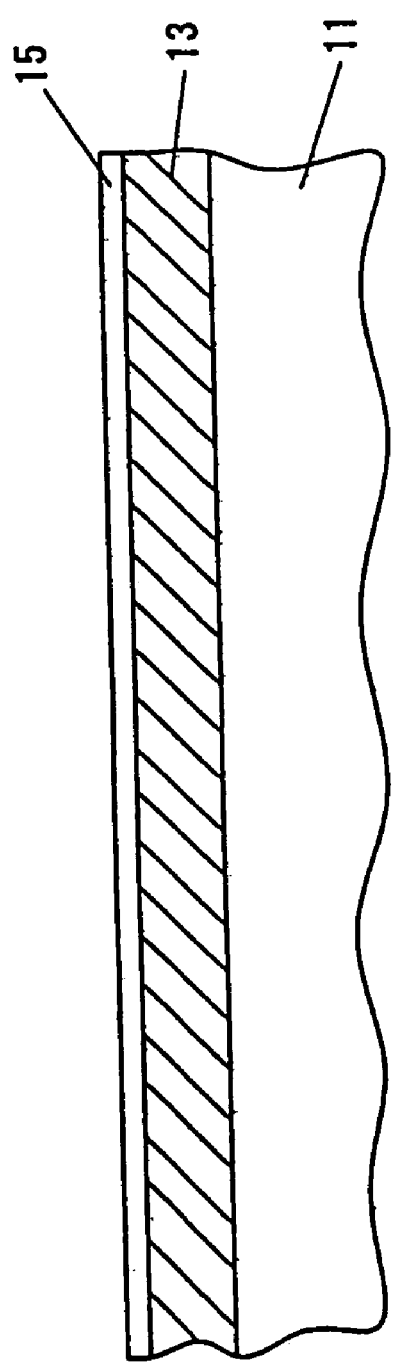
FIG. 2A and FIG. 2B are sectional views of appropriate portions for description of a process for forming a wiring portion of the semiconductor device shown in FIG. 1.

First, as shown in FIG. 2A, a substrate in which a wiring layer 13 and an insulation membrane 15 are laminated on a semiconductor substrate 11 in order is prepared. The wiring layer 13 is formed by, for example, depositing aluminum using a spattering method, etc., on the surface of the semiconductor substrate 11.

Although the thickness of the wiring layer 13 is not specially limited, the thickness may be made 1 micrometer thick or more and 4 micrometers or less. Preferably still, it may be made 2 micrometers or more and 3 micrometers or less.

The insulation membrane 15 is formed by, for example, depositing a silicon oxide using a CVD (Chemical Vapor Deposition) method, etc., on the surface of the wiring layer 13. In the embodiment, the thickness of the insulation membrane 15 is made approx. 0.3 micrometers. A detailed description is given of the thickness of the insulation membrane 15.

Figure 2B:
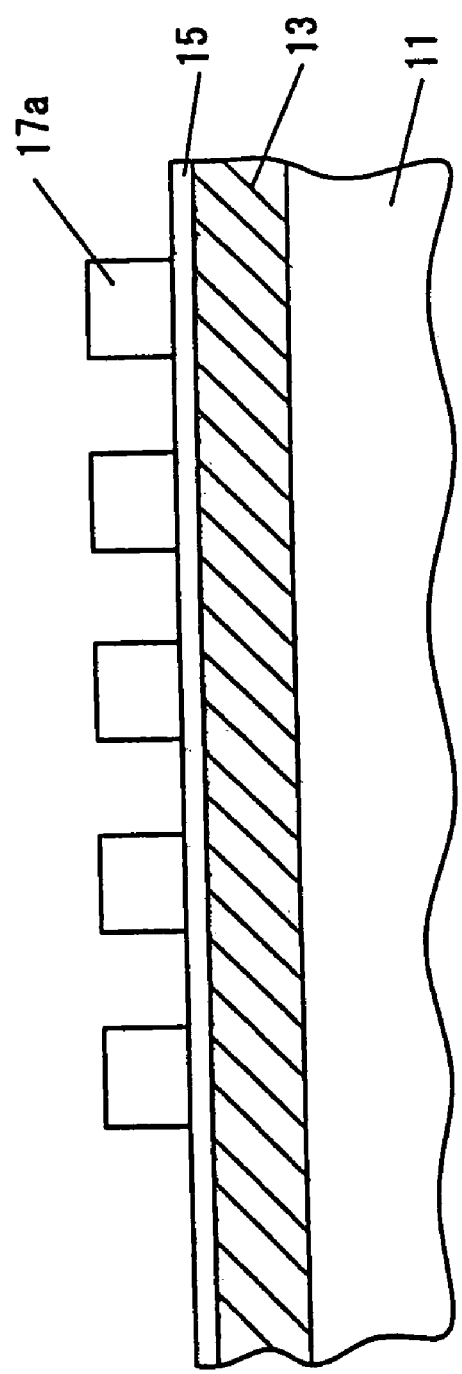

Subsequently, as shown in FIG. 2B, photoresist 17a of a prescribed pattern is formed on the surface of the insulation membrane 15. The photoresist 17a is formed by, for example, the painting processes of a photosensitive resin, exposure of a pattern, development thereof, and baking, etc.

The thickness of the photoresist 17a is not specially limited. However, for example, it is preferable that the thickness is determined to a thickness which scarcely lowers the resolution power and deforms the photoresist in exposure, and scarcely generates foaming or deformation in baking. Therefore, generally, it is preferable that the photoresist 17a is thin. On the other hand, since the photosensitive resin is a material of a reaction-generating substance that protects the etching section during etching of the wiring layer 13, an appropriate amount (thickness) of the photosensitive resin is required.

In view of such points, the thickness of the photoresist 17a is made, for example, 2 micrometers or more and 4 micrometers or less. Preferably still, it may be made 2.5 micrometers or more and 3 micrometers or less.

Also, the composition of the photosensitive resin is not specially limited. However, for example, a positive resist, which is composed of resin (Novolac resin) of 20 through 24%, a photoactive compound of 8 through 9%, a pigment constituent (Dye) of 2%, and a solvent (2-Heptanone) of 65 through 70%, may be used.

Next, as shown in FIG. 3A, by carrying out dry etching using a fluorine-based gas, which is the first etching using the photoresist 17a as a mask, the insulation membrane 15 is patterned and an auxiliary mask 15a is formed. The dry etching using a fluorine-based gas is not specially limited. However, for example, the dry etching may be carried out by an RIE (Reactive Ion Etching) method, etc., in which $CF_4$, $CHF_3$, and Ar is used as etching gas.

In this case, the etching rate (etching speed) in the first etching is, for example, approx. 4,500 angstroms per minute with respect to a silicon oxide, approx. 50 angstroms per minute with respect to aluminum, and approx. 1,000 angstroms per minute with respect to the photoresist. Therefore, the wiring layer 13 and photoresist 17a are scarcely etched in the first etching.

Next, by carrying out dry etching using a chlorine-based gas, which is the second etching, using the auxiliary mask 15a formed in the first etching and the remaining photoresist 17a as masks, as shown in FIG. 3B, a wiring 13a is formed by patterning the wiring layer 13. Although the dry etching using a chlorine-based gas is not specially limited, for example, the dry etching may be carried out by an ECR (Electron Cyclotron Resonance) method using $Cl_2$, $BCl_3$ and He.

In this case, the etching rate (etching speed) in the second etching is, for example, approx. 11,000 angstroms per minute with respect to aluminum, approx. 600 through 1,500 angstroms per minute with respect to a silicon oxide, and approx. 4,200 angstroms per minute with respect to the photoresist. Therefore, although, in the second etching, the photoresist 17a is etched to some degree (equivalent to 38 percent or the like of the wiring layer 13), the auxiliary mask 15a is scarcely etched (equivalent to only 14 percent or the like of the wiring layer 13).

Accordingly, even if the thickness of the photoresist 17a is almost the same as that of the prior art, it is possible to pattern the wiring layer 13 which is thicker than the thickness thereof in the prior art.

In addition, the dry etching using a chlorine-based gas as the second etching may be based on, for example, the RIE method other than the above-described ECR method. It may be appropriately subjected to a change. However, if the ECR method is employed, since it is possible to independently control the acceleration power of ions and the generation power of radicals, the etching speed of the photoresist 17a may be made lower with respect to the etching speed of the wiring layer. This is still more convenient.

Next, the remaining photoresist 17a is removed (peeled off) by, for example, ashing (that is, ashing treatment), and thereafter, as shown in FIG. 1, a passivation membrane 19 is formed by using the CVD (Chemical Vapor Deposition) method, etc.

In regard to the ashing, it is possible to remove the photoresist 17a in a short time because the amount of the remaining photoresist 17a is slight after the second etching. Also, it is not necessary to remove the auxiliary mask 15a because it is a silicon oxide membrane. Therefore, the ashing time will not be lengthened.

Figure 4A:
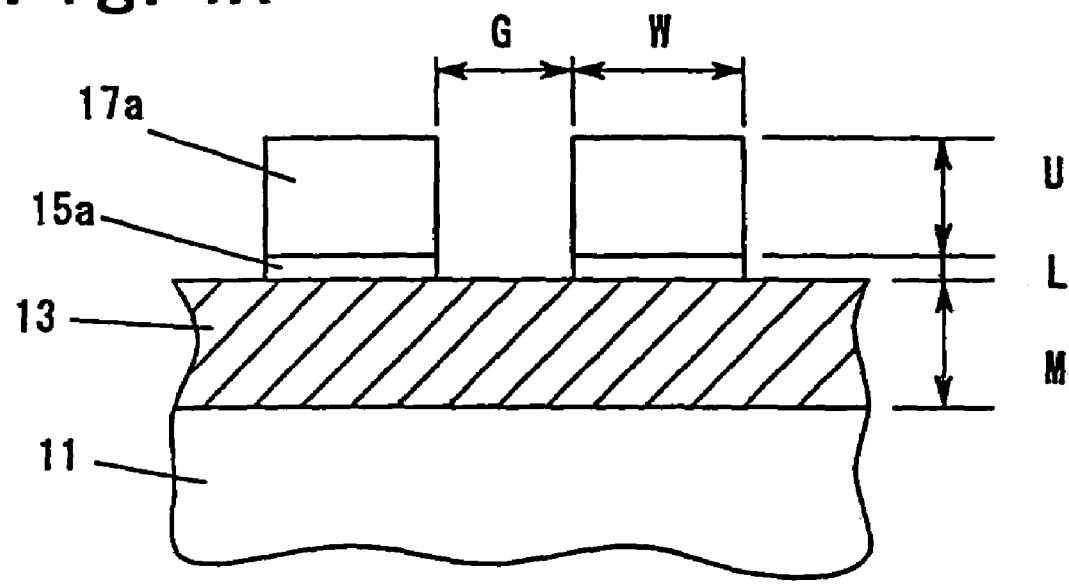
FIG. 4A is an enlarged view of FIG. 3A.
Figure 4B:
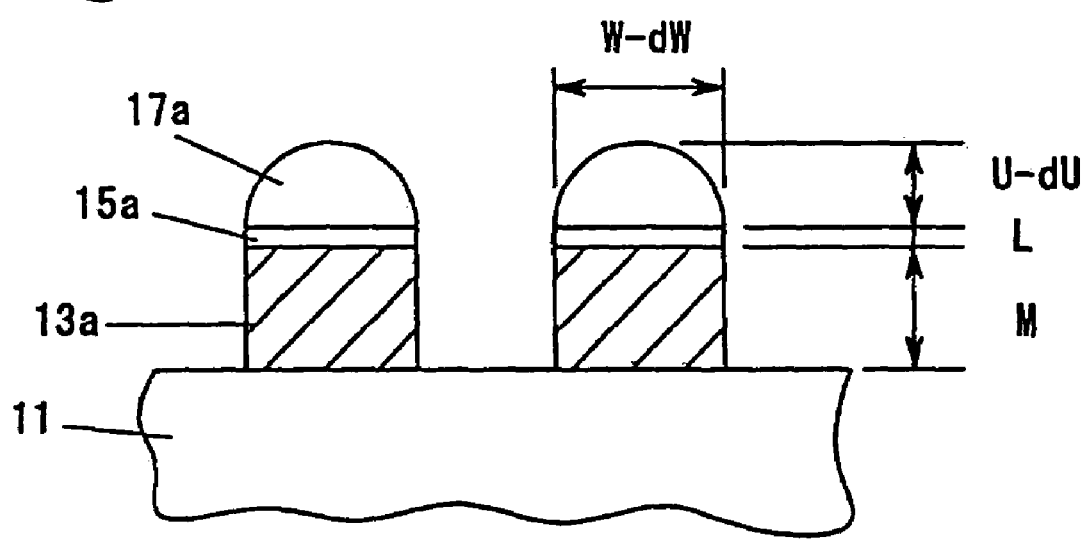
FIG. 4B is an enlarged view of FIG. 3B.
Figure 5A:
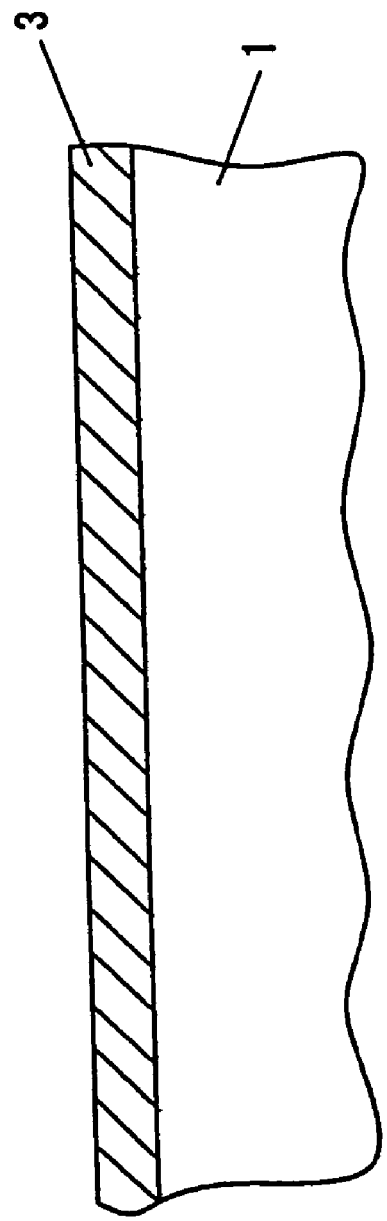
FIG. 5A and FIG. 5B are sectional views of appropriate portions for description of a prior art method for forming a wiring portion of a semiconductor device using a photolithography method.
Figure 5B:
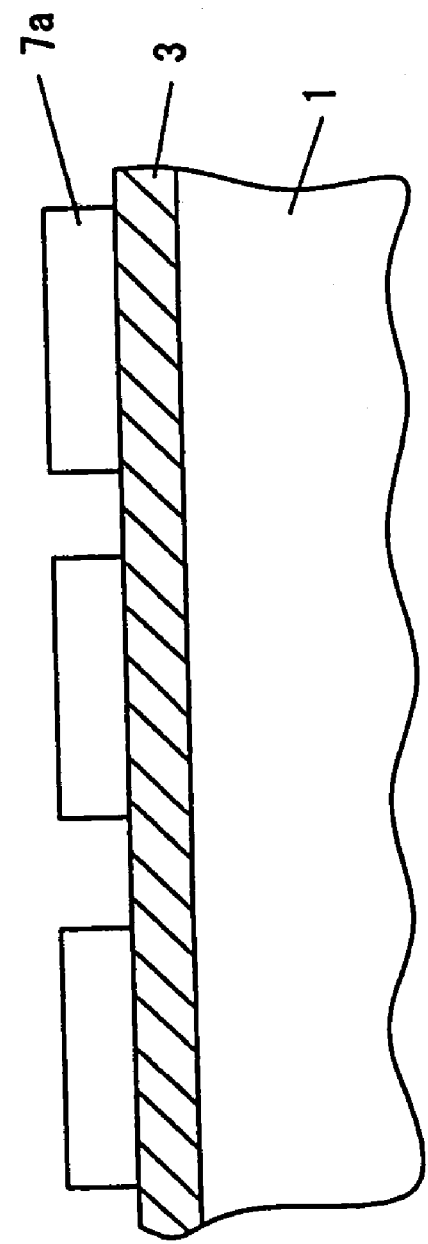
Figure 6A:
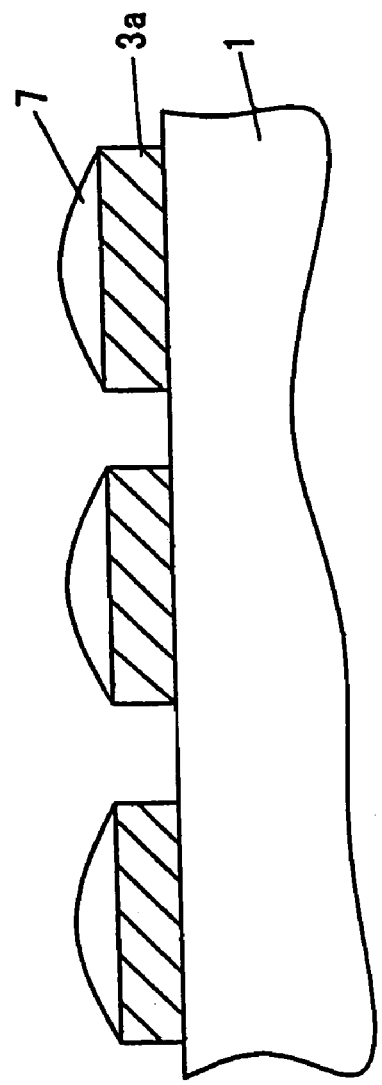
FIG. 6A and FIG. 6B are sectional views of appropriate portions for description of a prior art method for forming a wiring portion of a semiconductor device using a photolithography method.
Figure 6B:
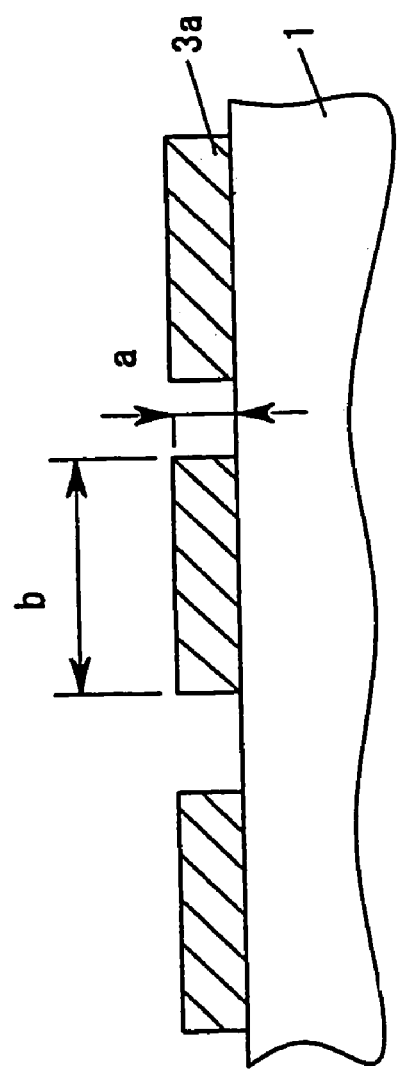

As described above, in the present embodiment, although the thickness of the insulation membrane 15 is set to 0.3 micrometers, a description is given of the basis thereof. FIG. 4A and FIG. 4B are, respectively, enlarged views of FIG. 3A and FIG. 3B.

As shown in FIG. 4A and FIG. 4B, in the embodiment, where it is assumed that, prior to the second etching, the minimum clearance between the respective photoresists 17a is G, the thickness of the photoresist 17a is U, the thickness of the wiring layer 13 is M, and that the permissible maximum aspect ratio for patterning the wiring layer 13 is A, and the width of the wiring 13a patterned by the second etching is made smaller by a prescribed permissible amount dW than the width W of the photoresist 17a before the second etching, and time required to reduce the width of the above-described auxiliary mask 15a by the prescribed permissible amount dW by the second etching is TL, and the minimum value of the etching speed of the auxiliary mask 15a in the second etching is RL, the thickness L of the auxiliary mask layer 15 is determined so that it may meet the following inequality "TL*RL<=L<=A*G−(U+M)".

A further detailed description is given of the above for carrying out the second etching, if the aspect ratio (U+L+M)/G exceeds the permissible maximum aspect ratio A, defective patterning occurs due to notching at the lower part of the wiring 13a. For the aspect ratio (U+L+M)/G not to exceed the permissible maximum aspect ratio A, it is necessary that the thickness L of the auxiliary mask layer 15 is A*G−(U+M) or less.

For example, where it is assumed that U =2.7 (micrometers), M=2.7 (micrometers), G=2.7 (micrometers), and A=2.2 (micrometers), L<=0.54 is established.

On the other hand, the width of the wiring 13a is made smaller than the width W of the photoresist 17a prior to the second etching by the second etching. However, in order to suppress the amount of making the width of the wiring 13a smaller to be the prescribed permissible amount dW or less, it is necessary to suppress the amount of reduction of the auxiliary mask 15a due to the second etching to be the above dW or less. In order to suppress the amount of reduction of the auxiliary mask 15a to be the above-described dW or less, the thickness L of the auxiliary mask membrane 15 must be the product of the above-described TL*RL or more.

Herein, where it is assumed that the width of the wiring 13a is made small by dW after the width of the auxiliary mask 15a is reduced by the prescribed permissible amount dW by the second etching, the total etching time (TT) of the second etching becomes TT=TL+(Time TM required for the width of the wiring 13a to be reduced by the prescribed permissible amount dW in the second etching). That is, TL=TT−TM.

For example, where M=2.7 (micrometers) is assumed, the total etching time TT in the second etching becomes TT=27,000/11,000*60*2, that is, approx. 294 seconds where the over-etching time is the same as the just-etching time.

On the other hand, where it is assumed that the prescribed permissible amount dW is 1/10 through 1/15 or the like of the width W, for example, 0.2 micrometers, the time required for the width of the wiring 13a to be reduced by the prescribed permissible amount dW in the second etching customarily becomes 110 seconds.

Therefore, TL=294−110=184 seconds. Also, as described above, since the minimum value of the etching speed of the auxiliary mask 15a in the second etching becomes RL=600 (angstroms per minute), TL*RL=184*600/60/10,000 is established. That is, it becomes approx. 0.18 micrometers.

Based on the above result, it is satisfactory if the thickness L of the auxiliary mask layer 15 meets 0.18 micrometers<=L<=0.54 micrometers. In the embodiment, on the basis of the above result, the thickness L of the auxiliary mask 15 is set to L=0.3 micrometers.

The embodiment is thus constructed, in which a semiconductor substrate 11 on which a wiring layer 13 composed of aluminum is formed is prepared, an insulation membrane 15 composed of a silicon oxide so as to cover the wiring layer 13 is formed, a photoresist 17a of a prescribed pattern is formed on the upper part of the insulation membrane 15 so as to be brought into contact with the insulation membrane 15, the insulation membrane 15 is patterned to form the auxiliary mask 15a by carrying out the first etching which is dry etching using a fluorine-based gas with the photoresist 17a used as a mask, and the wiring layer 13 is patterned by carrying out the second etching, which is dry etching using a chlorine-based gas, using the auxiliary mask 15a formed in the first etching and the remaining photoresist 17a as masks.

In the first etching, the etching speed with respect to the photoresist 17a is remarkably slight in comparison to that with respect to the insulation membrane 15. Therefore, the total thickness of the auxiliary mask 15a formed in the first etching and the remaining photoresist 17a, that is, the thickness of a mask for the second etching can be made considerably thicker than the thickness of the original photoresist 17a.

Further, in the second etching, the etching speed with respect to the photoresist 17a is considerably lower than the etching speed with respect to the wiring layer 13, and is considerably higher than the etching speed with respect to the auxiliary mask 15a.

Therefore, if the thickness of photoresist according to the embodiment is equivalent to the thickness of the photoresist according to the prior art, a considerably long period of etching is enabled in comparison with the prior art method for carrying out etching corresponding to the second etching using only the photoresist. Accordingly, for example, even in a case of a wiring layer for which patterning is required over a considerably longer period of time of etching than in the prior art, it becomes possible to use photoresist having a thickness similar to that of the prior art photoresist.

That is, even in a case where a semiconductor device has a considerably thicker wiring layer than the thickness in the prior art, it becomes possible to achieve a semiconductor device in which faults of the shape of patterned wiring layers are as less as in the prior art method.

In addition, in the above-described embodiment, a description was given of a case where the insulation membrane which becomes an auxiliary mask is composed of a silicon oxide. However, the insulation membrane which becomes an auxiliary mask is not limited to a silicon oxide. For example, even in a case where the insulation membrane which becomes an auxiliary mask is composed of a silicon nitride or a silicon nitride oxide, the present invention is applicable thereto. Further, where the auxiliary mask layer is composed of a layer other than the insulation membrane, the invention is applicable thereto.

Also, in the above-described embodiment, a description was given of the case where the wiring layer is composed of aluminum, as an example. The invention is not limited thereto. For example, the invention is applicable to cases where the wiring layer is composed of a metal other than aluminum or a substance other than metals. Further, the invention is also applicable to cases where the layer to be patterned is composed of a layer other than a wiring layer.

Still further, in the above-described embodiment, a description was given of dry etching as the first etching, in which a fluorine-based gas is used, as an example. The invention is not limited thereto. For example, dry etching in which a gas other than a fluorine-based gas or wet etching is used, may be carried out as the first etching. In addition, a combination thereof may be also carried out as the first etching.

Also, in the above-described embodiment, a description was given of dry etching as the second etching, in which a chlorine-based gas is used, as an example. However, the invention is not limited thereto. For example, dry etching using a gas other than chlorine-based gas, for example, bromine-based gas, or wet etching may be carried out as the first etching. Further, a combination thereof may be made into the second etching.

A method for producing a semiconductor device according to the invention comprises the steps of: preparing a semiconductor substrate on which a layer to be patterned is formed; forming an auxiliary mask layer so that the auxiliary mask layer covers said layer to be patterned; forming photoresist of a prescribed pattern so that the photoresist is brought into contact with the auxiliary mask layer on the upper part of the auxiliary mask layer; patterning the auxiliary mask layer by carrying out the first etching for which the etching speed with respect to the photoresist is lower than that with respect to the auxiliary mask layer using the photoresist as a mask, and forming a auxiliary mask; and patterning the layer to be patterned by carrying out the second etching for which the etching speed with respect to the photo resist is lower than that with respect to the layer to be patterned, and is higher than the etching speed with respect to the auxiliary mask, using the auxiliary mask, which is formed through the first etching, and the remaining photoresist as masks.

In the first etching, the etching speed with respect to photoresist is lower than the etching speed with respect to an auxiliary mask layer. For this reason, the total thickness of the auxiliary mask formed in the first etching and the remaining photoresist, that is, the thickness of a mask for the second etching, can be made thicker than the thickness of the original photoresist.

In addition, in the second etching, the etching speed with the photoresist is lower than the etching speed with respect to a layer to be patterned, but higher than the etching speed with respect to the auxiliary mask.

Therefore, if the thickness of photoresist according to the embodiment is equivalent to the thickness of the photoresist according to the prior art, a considerably long period of etching is enabled in comparison with the prior art method for carrying out etching corresponding to the second etching using only the photoresist. Accordingly, for example, even in a case of a layer to be patterned for which patterning is required with a considerably longer period of time of etching than in the prior art, it becomes possible to use photoresist having a thickness similar to that of the prior art photoresist.

That is, even in a case where a semiconductor device has a considerably thicker layer to be patterned than the thickness in the prior art, it becomes possible to achieve a semiconductor device in which faults of the shape of patterned layers are as less as or less than in the prior art method.

The method for producing a semiconductor device according to the invention is featured in that, in the first etching, the etching speed with respect to a layer to be patterned is lower than the etching speed with respect to the auxiliary mask layer. Therefore, in the first etching, it is difficult for the patterned layer to be etched. Accordingly, in the first etching, it becomes easy to control so that only the auxiliary mask layer is etched.

The method for producing a semiconductor device according to the invention is featured in that, where it is assumed that, prior to the second etching, the minimum clearance between the respective photoresists is G, the thickness of the photoresist is U, the thickness of the layer to be patterned is M, and that the permissible maximum aspect ratio for patterning the layer to be patterned is A, and the width of the layer to be patterned patterned by the second etching is made smaller by a prescribed permissible amount than the width of the photoresist before the second etching, and time required to reduce the width of the auxiliary mask by the prescribed permissible amount by the second etching is TL, and the minimum value of the etching speed of the auxiliary mask in the second etching is RL, the thickness L of the auxiliary mask layer is determined so that it may meet the following inequality "TL*RL<=L<=A*G−(U+M). Also, in the present specification or claims, [P*Q] expresses [the product of P multiplied by Q], and [P<=Q] expresses [P is smaller than Q or P is equal to Q].

In addition, the method for producing a semiconductor device according to the invention is featured in that the prescribed permissible amount is ⅟20 or more and ⅟10 or less of the width of the photoresist before the second etching, and the permissible maximum aspect ratio A is 2.2.

Therefore, by determining the thickness L of the auxiliary mask layer so that it meets the above-described inequality, the width of the layer to be patterned by the second etching does not become smaller than the width of the photoresist before the second etching beyond the prescribed permissible amount, and it becomes possible to prevent patterning defects such as notching, etc., from occurring in the second etching.

The method for producing a semiconductor device according to the invention is featured in that the layer to be patterned is a wiring layer, and the auxiliary mask layer is an insulation membrane.

Therefore, even in a case where thicker wiring than in the prior art is carried out, it becomes possible to produce a semiconductor device in which defectives in the shape of wiring are minimalized. In addition, the above-described insulation membrane does not impair reliability in operation of a semiconductor device unlike the photoresist even if it remains in a final product. Accordingly, it becomes possible to achieve a semiconductor device having high reliability in operation.

The method for producing a semiconductor device according to the invention is featured in that the wiring layer is composed of a metal including aluminum, the insulation membrane is composed of an insulative substance including silicon, and the first etching is dry etching using a fluorine-based gas.

Therefore, the selective property is remarkably high with respect to the insulation membrane in the first etching. For this reason, in the first etching, the photoresist and wiring layer are scarcely etched. That is, it is possible to carry out etching of the insulation membrane almost without reducing the thickness of the photoresist. In addition, it becomes remarkably easy to control so that only the insulation membrane can be etched without etching the wiring layer.

The method for producing a semiconductor device according to the invention is featured in that the wiring layer is composed of a metal including aluminum, the insulation membrane is composed of an insulative substance including silicon, and the second etching is dry etching using a chlorine-based gas.

Therefore, in the second etching, although the photoresist is etched to some degree when etching the wiring layer, the insulation membrane is scarcely etched. Accordingly, even if the insulation membrane is comparatively thin, it can function as a mask for the second etching and provide an effect. That is, it is possible to make the photoresist thinner still.

A semiconductor device according to the invention includes wiring of a prescribed pattern formed on a semiconductor substrate, and an insulation membrane, which is utilized as a mask for patterning the wiring, and which is provided in contact with the wiring on the wiring, and has the same pattern as that of the wiring.

Therefore, since the photoresist and insulation membrane are combined and utilized as a mask for patterning the wiring, it is possible to obtain thicker wiring than in a case of using only the photoresist as a mask. That is, it is possible to achieve a semiconductor device having less defectives in shape and having thicker wiring than in the prior art.

Furthermore, the above-described insulation membrane does not impair the reliability in operation of a semiconductor device unlike the photoresist even if it remains in a final product. Therefore, a semiconductor device having high reliability in operation can be brought about.

While the present invention is described above by way of a preferable embodiment, the terms used herein are not restrictive but illustrative and they may be changed within the scope of appended claims without departing from the scope and spirit of the present invention.

What is claimed is:

1. A method for producing a semiconductor device comprising steps of:
    preparing a semiconductor substrate on which a layer to be patterned is formed;
    forming an auxiliary mask layer so that the same layer covers said layer to be patterned;
    forming photoresist of a prescribed pattern so that the photoresist is brought into contact with the auxiliary mask layer on the upper part of the auxiliary mask layer;
    patterning the auxiliary mask layer by carrying out the first etching for which the etching speed with respect to the photoresist is lower than that with respect to the auxiliary mask layer using the photoresist as a mask, and forming a auxiliary mask; and
    patterning the layer to be patterned by carrying out the second etching for which the etching speed with respect to the photoresist is lower than that with respect to the layer to be patterned, and is higher than the etching speed with respect to the auxiliary mask, using the auxiliary mask, which is formed through the first etching, and the remaining photoresist as masks;
    wherein, where it is assumed that, prior to said second etching, the minimum clearance between said respective photoresists is G, the thickness of the photoresist is U, the thickness of said layer to be patterned is M, and that the permissible maximum aspect ratio for patterning the layer to be patterned is A, and the width of the layer to be patterned by the second etching is made smaller by a prescribed permissible amount than the width of the photoresist before the second etching, the thickness L of said auxiliary mask layer is determined so that said prescribed permissible amount is 1/10 or less of the width of the photoresist before said second etching, and so that it may meet the following inequality:

$L <= A*G-(U+M)$.

2. The method for producing a semiconductor device as set forth in claim 1, wherein said prescribed permissible amount is 1/20 or more and 1/10 or less of the width of the photoresist before said second etching, and said permissible maximum aspect ratio A is 2.2.

3. The method for producing a semiconductor device as set forth in claim 1, wherein said layer to be patterned is a wiring layer, and said auxiliary mask layer is an insulation membrane.

4. The method for producing a semiconductor device as set forth in claim 3, wherein said wiring layer is composed of a metal including aluminum, said insulation membrane is composed of an insulative substance including silicon, and said first etching is dry etching using a fluorine-based gas.

5. The method for producing a semiconductor device as set forth in claim 4, wherein said first etching is carried out by an RIE (Reactive Ion Etching) method using CF4, CHF3, and Ar as etching gas.

6. The method for producing a semiconductor device as set forth in claim 4, wherein said wiring layer is composed of aluminum, said insulation membrane is composed of a silicon oxide, and the etching speed in said first etching is approx. 4,500 angstroms per minute with respect to a silicon oxide, approx. 50 angstroms per minute with respect to aluminum, and approx. 1,000 angstroms per minute with respect to the photoresist.

7. The method for producing a semiconductor device as set forth in claim 3, wherein said wiring layer is composed of a metal including aluminum, said insulation membrane is composed of an insulative substance including silicon, and said second etching is dry etching using a chlorine-based gas.

8. The method for producing a semiconductor device as set forth in claim 7, wherein said second etching is carried out by an ECR (Electron Cyclotron Resonance) method using Cl2, BCl3, and He as etching gas.

9. The method for producing a semiconductor device as set forth in claim 7, wherein said wiring layer is composed of aluminum, said insulation membrane is composed of a silicon oxide, and the etching speed in said second etching is approx. 11,000 angstroms per minute with respect to aluminum, approx. 600 through 1,500 angstroms per minute with respect to a silicon oxide, and approx. 4,200 angstroms per minute with respect to the photoresist.

10. The method for producing a semiconductor device as set forth in claim 3, wherein the thickness of said wiring layer is 1 micrometer or more but 4 micrometers or less, and the thickness of said photoresist is 2 micrometers or more but 4 micrometers or less.

11. The method for producing a semiconductor device as set forth in claim 10, wherein the thickness of said insulation membrane is 0.18 micrometers or more but 0.54 micrometers or less.

12. The method for producing a semiconductor device as set forth in claim 3, wherein the thickness of said wiring layer is 2 micrometers or more but 3 micrometers or less, and the thickness of said photoresist is 2.5 micrometers or more but 3 micrometers or less.

13. The method for producing a semiconductor device as set forth in claim 12, wherein the thickness of said insulation membrane is approx. 0.3 micrometers.

14. The method for producing a semiconductor device as set forth in claim 3, wherein the thickness of said wiring layer is 2.7 micrometers, the thickness of said photoresist is 2.7 micrometers, the minimum clearance between said respective photoresists is 2.7 micrometers, and said permissible maximum aspect ratio A is 2.2.

* * * * *